United States Patent
Camillo-Castillo et al.

(10) Patent No.: US 9,263,782 B2
(45) Date of Patent: Feb. 16, 2016

(54) NOTCH FILTER STRUCTURE WITH OPEN STUBS IN SEMICONDUCTOR SUBSTRATE AND DESIGN STRUCTURE

(71) Applicant: INTERNATIONAL BUSINESS MACHINES CORPORATION, Armonk, NY (US)

(72) Inventors: Renata Camillo-Castillo, Essex Junction, VT (US); Hanyi Ding, Colchester, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 428 days.

(21) Appl. No.: 13/748,048

(22) Filed: Jan. 23, 2013

(65) Prior Publication Data

US 2014/0203894 A1   Jul. 24, 2014

(51) Int. Cl.
*H01P 1/203*    (2006.01)
*G06F 17/50*    (2006.01)

(52) U.S. Cl.
CPC .......... *H01P 1/2039* (2013.01); *G06F 17/5036* (2013.01); *G06F 17/5045* (2013.01)

(58) Field of Classification Search
CPC ............. H01P 5/04; H01P 1/203; H01P 7/08; H01P 7/082; H01P 7/086; H01P 1/2039; G06F 17/5045; G06F 17/5036
USPC .................................. 333/204, 219, 238, 246
See application file for complete search history.

(56) References Cited

U.S. PATENT DOCUMENTS

| | | | |
|---|---|---|---|
| 7,705,695 B2 * | 4/2010 | Kushta | 333/204 |
| 7,772,124 B2 | 8/2010 | Bavisi et al. | |
| 8,120,145 B2 | 2/2012 | Bavisi et al. | |
| 2008/0258311 A1 * | 10/2008 | Asano | 257/776 |
| 2009/0311841 A1 | 12/2009 | Bavisi et al. | |
| 2010/0265011 A1 * | 10/2010 | Ding et al. | 333/204 |
| 2011/0102105 A1 | 5/2011 | Rogers | |
| 2011/0187000 A1 | 8/2011 | West | |
| 2012/0007251 A1 | 1/2012 | Hwang et al. | |

FOREIGN PATENT DOCUMENTS

WO    2012057708 A1    5/2012

OTHER PUBLICATIONS http://en.wikipedia.org/wiki/back_end_of_line; Definition of "Back end of Line", Accessed on Apr. 27, 2015.*
Mardani et al. "A novel multi-notch compact monopole antenna for UWB applications", IEICE Electronics Express, vol. 8, No. 20, 1698-1702, Oct. 2011.

(Continued)

*Primary Examiner* — Benny Lee
*Assistant Examiner* — Jorge Salazar, Jr.
(74) *Attorney, Agent, or Firm* — Anthony Canale; Andrew M. Calderon; Roberts Mlotkowski Safran & Cole, P.C.

(57) ABSTRACT

On-chip millimeter wave (mmW) notch filters with via stubs, methods of manufacture and design structures are disclosed. The notch filter includes a signal line comprising a metal trace line connected to a metal via stub partially extending into a semiconductor substrate. The notch filter further includes a defected ground plane connected to at least one or more additional metal via stubs partially extending into the semiconductor substrate.

20 Claims, 6 Drawing Sheets

(56) References Cited

OTHER PUBLICATIONS

Coumar et al. "Resonator Based Compact Ultra-Wideband and Notched Wideband Filters", 2010 IEEE, 3 pages.

Cho et al. "Modeling and Analysis of Through-Silicon Via (TSV) Noise Coupling and Suppression Using a Guard Ring", IEEE Transaction on Components, Packaging, and Manufacturing Technology, vol. 1, No. 2, Feb. 2011, pp. 220-233.

* cited by examiner

| Vertical Design of the Present Invention | | | | | | Conv. Coplanar Notch Filter | | | | | | |
|---|---|---|---|---|---|---|---|---|---|---|---|---|
| Via length | Lx | Ly | Area | Notch Frequency GHz | | Metal strip length | Lx | Ly | Area | Notch Frequency GHz | | Ratio= New/ Conventional |
| 50 | 66 | 57.38 | 3787.08 | 187 | | 233 | 67.12 | 96.19 | 6456.273 | 191 | | 0.586573727 |
| 60 | 66 | 67.38 | 4447.08 | 157 | | 277 | 67.12 | 118.19 | 7932.913 | 158 | | 0.560586018 |
| 70 | 66 | 77.38 | 5107.08 | 137 | | 318 | 67.12 | 138.69 | 9308.873 | 137 | | 0.548624963 |
| 80 | 66 | 87.38 | 5767.08 | 122 | | 357 | 67.12 | 158.19 | 10617.71 | 122 | | 0.543156526 |
| 90 | 66 | 97.38 | 6427.08 | 110 | | 397 | 67.12 | 178.19 | 11960.11 | 108 | | 0.537376203 |

NOTCH FILTER STRUCTURE WITH OPEN STUBS IN SEMICONDUCTOR SUBSTRATE AND DESIGN STRUCTURE

FIELD OF THE INVENTION

The invention relates to semiconductor structures and, more particularly, to on-chip millimeter wave (mmW) notch filters with via stubs in a semiconductor substrate, methods of manufacture and design structures.

BACKGROUND

Millimeter wave integrated circuits have become popular for various applications, such as base station wireless backhauls at 40 GHz, 70 GHz and 80 GHz bands, wireless personal networks at 60 GHz band, vehicle collision avoidance radar system at 75 GHz band, security imaging system at 94 GHz band, etc. Notch filters are commonly used for millimeter wave integrated circuits in order to filter out unwanted frequency components, such as image or harmonic generated by nonlinearity of an active device.

On-chip notch filters can be formed using back end of the line (BEOL) processes. In such processes, the notch filters can be provided as microstrip line or coplanar waveguide structures, which have an electrical length of quarter wavelength at the notch frequency and open circuit at one end, as known as a quarter wavelength open stub. Such structures take significant chip area, even though some size reduction techniques can be used, like meandering the straight transmission line structure into serpentine or spiral like structures, which normally use multiple bends. However, such structures may suffer performance degradation.

Accordingly, there exists a need in the art to overcome the deficiencies and limitations described hereinabove.

SUMMARY

In an aspect of the invention, a notch filter comprises a transmission line comprising a metal trace line connected to a metal via stub partially extending into a semiconductor substrate. The notch filter further comprises a ground plane with ground opening, the ground plane being connected to at least one or more additional metal via stubs partially extending into the semiconductor substrate.

In an aspect of the invention, a method comprises forming a plurality of via stubs partially within a semiconductor substrate and which are free at one end. The method further comprises forming a ground plane in the back end of line process, the ground plane being formed with an opening. The method further comprises forming a signal line in electrical contact with a via stub of the plurality of via stubs, through the opening of the ground plane. The transmission line is formed on a different level of the back end of line process than the ground plane.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the on-chip millimeter wave (mmW) notch filters with through semiconductor via open stubs, which comprises the structures of the present invention. In still further embodiments, a method in a computer-aided design system is provided for generating a functional design model of the on-chip millimeter wave (mmW) notch filters with through semiconductor via open stubs. The method comprises generating a functional representation of the structural elements of the on-chip millimeter wave (mmW) notch filters with through semiconductor via open stubs.

In aspects of the invention, a method is provided in a computer-aided design system for generating a functional design model of a notch filter. The method comprises: generating a functional representation of a transmission line comprising a trace line connected to a via stub partially extending into a semiconductor substrate and which is open ended; and generating a functional representation of a ground plane connected to at least one or more additional via stubs partially extending into the semiconductor substrate and which are open ended, wherein the ground plane is provided on a different level of the back end of line process than the trace line.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 3 shows a comparison of chip area used by the notch filter of the present invention and the conventional on-chip microstrip line notch filter;

DETAILED DESCRIPTION

The invention relates to semiconductor structures and, more particularly, to on-chip millimeter wave (mmW) notch filters with via stubs in a semiconductor substrate, methods of manufacture and design structures. In embodiments, the notch filters of the present invention utilize open ended vias (vias which are not grounded to any ground plane structure) to form portions of a transmission or signal line of the on-chip millimeter wave (mmW) notch filter. More specifically, the open ended vias can be vertical stubs, which provide an open quarter wavelength transmission line with the transmission line in the back end of line process. Advantageously, the notch filters of the present invention will have similar performance as conventionally formed microstrip line or co-planar waveguide notch filters using full BEOL processes, but will use a significantly smaller amount of chip area due to the vertical orientation of its via stubs. For example, in embodiments, the notch filters of the present invention can use 40% less chip area than the traditional BEOL designs.

In more specific embodiments, the via stubs of the on-chip millimeter wave (mmW) notch filters are formed prior to back end of the line structures, e.g., ground plane and other structures of the traditional microstrip line or coplanar waveguide notch filters. For example, the via stubs of the present invention extend vertically into a semiconductor substrate, and are not coupled to any ground plane or other grounded bottom. Accordingly, the via stubs of the present invention will advantageously provide equivalent electrical performance in less surface area, compared to conventional BEOL microstrip lines or coplanar waveguides formed upon a surface of a semiconductor substrate. That is, the via stubs of the present invention will provide signaling paths to a top of the semiconductor substrate and then connect to the transmission line formed on a top of the semiconductor substrate, where the overall signaling path electrical length equals the quarter wavelength of the notch frequency, while using less chip area as conventional structures.

Figure 1:
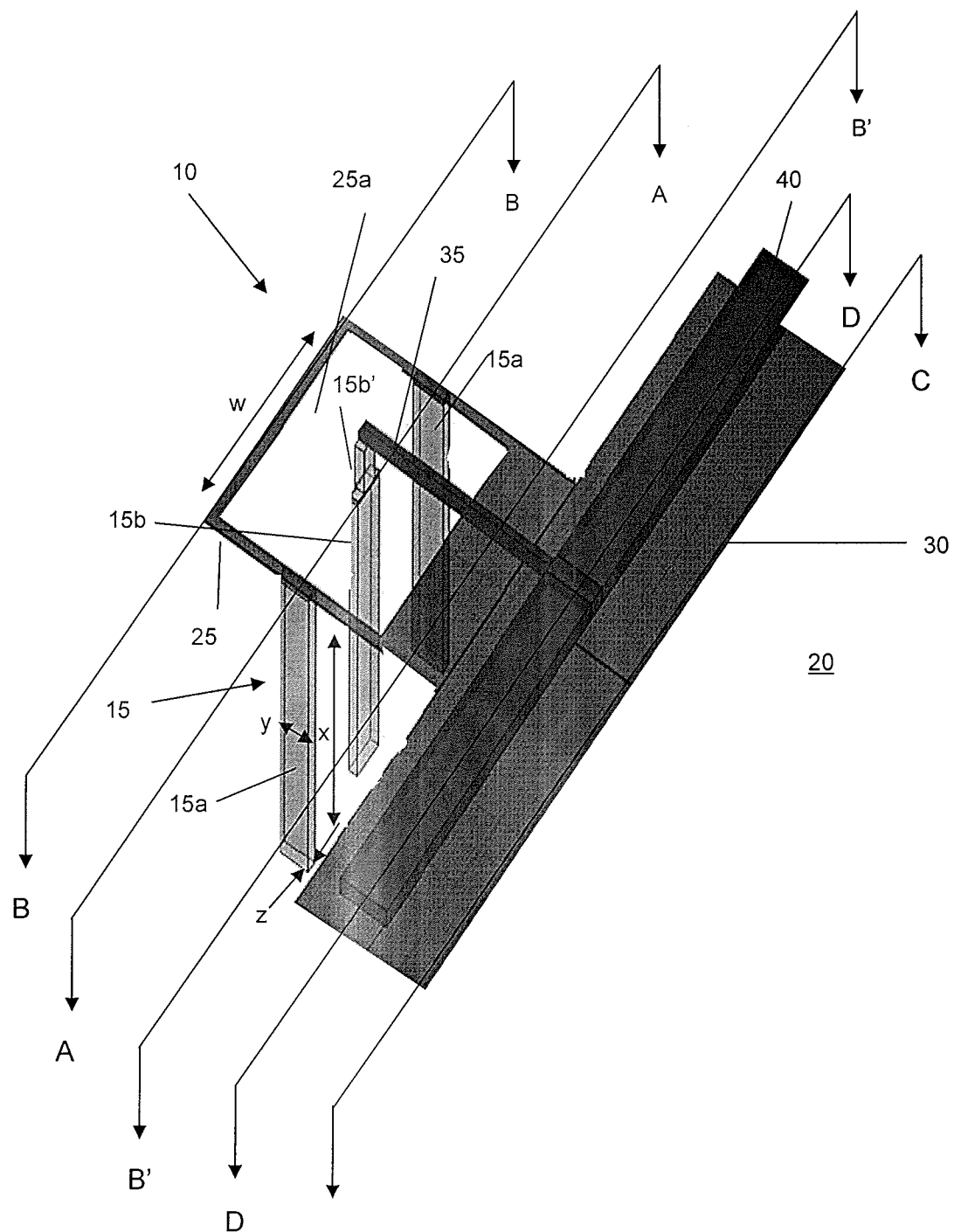
FIG. 1 shows an on-chip millimeter wave (mmW) notch filter with through silicon via stubs in accordance with aspects of the present invention.

FIG. 1 shows an on-chip millimeter wave (mmW) notch filter with silicon via stubs in accordance with aspects of the present invention. In this representation, an on-chip notch filter 10 comprises one or more via stubs 15 formed through one or more layers of a substrate 20. As should be understood by those of ordinary skill in the art, the present invention contemplates any number of via stubs 15 to provide specific design performances of the on-chip millimeter wave (mmW) notch filter. In embodiments, the substrate 20 comprises a silicon-based substrate layer (or other semiconductor layer) and one or more dielectric layers. In embodiments, the dielectric layers can be, for example, any silicon compatible dielectric materials such as an oxide based material, e.g., $SiO_2$.

In embodiments, the via stubs 15 are formed only partially through the silicon-based substrate and one or more dielectric layers of the substrate 20. In this way, the via stubs 15 are embedded within the substrate 20 and are not grounded to a bottom ground plane of the structure, i.e., the via stubs may be exposed to the bottom of the silicon-based substrate, but are not connected to the ground plane at the bottom of the silicon-based substrate, as in conventional through silicon-based via technologies. The via stubs 15 can be formed from any appropriate metal using conventional chemical vapor deposition (CVD) processes. For example, the via stubs 15 can be aluminum, copper, tungsten or any Si compatible metals.

In embodiments, the dimensions of the via stubs 15 can vary depending on the desired performance criteria of the notch filter 10. For example, as an illustrative example, the via stubs 15 can have a height 'x' of about 10 microns to about 140 microns; although other dimensions are also contemplated by the present invention. The width 'y' of the via stubs 15 can range from about 10 microns to about 70 microns and the thickness 'z' of the via stubs 15 can range from about 3 microns to about 10 microns; although other dimensions are also contemplated by the present invention.

Still referring to FIG. 1, a ground plane 25 with a cutoff in the middle (e.g., defected ground plane) is connected to one or more of the via stubs 15a. The ground plane 25 joins a ground line 30 of a microstrip line. The ground line 30 and the signal line 40 form a microstrip line with certain characteristic impedance, e.g., 50 Ohm, for providing a signal path between devices or circuit blocks. Although only two via stubs 15a are shown connected to the ground plane 25, one of ordinary skill in the art would readily understand that one or more via stubs 15a can be connected to the ground plane 25, depending on the desired performance specifications of the notch filter 10. For example, one or more via stubs 15a can be electrically connected directly to the ground plane 25 in order to adjust the notch frequency or impedance of the notch filter 25.

In embodiments, the ground plane 25 of the notch filter of the present invention joins the ground line 30 of the microstrip line on a same level of the structure. In embodiments, the ground plane 25 and ground line 30 can be formed from a metal or metal alloy, e.g., aluminum, copper, tungsten or any Si compatible metal, using conventional CVD processes. Also, as the ground plane 25 and ground line 30 are formed at a same level of the structure. These structures can also be formed using the same lithography, etching and deposition (e.g., CVD) processes as described herein.

Still referring to FIG. 1, the ground plane 25 can have a dimension of about 50 microns across, e.g., see reference character "w"; although other dimensions are also contemplated by the present invention. Also, as shown in FIG. 1, the ground plane 25 has a ground opening (open central portion) 25a, the size of which is used to tune the notch filter performance, such as matching and notch depth. The ground opening 25a results in a "defected" ground plane 25. The ground opening 25a will further facilitate the electrical connection of a signal line 35 to a silicon via stub 15b, or through an extension 15b' (in the BEOL layers) of the via stud 15b, collectively being the transmission line of the notch filter. In embodiments, the size of the ground opening 25a and the configuration, e.g., dimensions, of the defected ground plane 25 can be adjusted for tuning the filter performance to provide, e.g., improved return loss (e.g., S11 and S22, or matching) and insertion loss (e.g., S21 or notch depth).

In embodiments, the defected ground plane 25 and more particularly the one or more via stubs 15a, surround via stub 15b which is electrically connected to the signal line 35. In embodiments, the signal line (metal trace line) 35 can be electrically connected directly to the silicon via 15b or through a via stud extension 15b' in the BEOL layers, e.g., dielectric layers, which depends at which metal layer the signal line 35 is formed. For example, the via stud extension 15b' can be used when the signal line 35 is formed at upper levels of the BEOL layers of the substrate 20, e.g., above the defected ground plane 25 and ground layer 30. In any scenario, a length sum of the signal line 35 and via stub 15b (or combination of via stub extension 15b' and via stub 15b) can be used to determine the notch frequency of the filter or can be determined by the notch frequency. For example, the notch frequency of the notch filter can be tuned by adjusting a length of the signal line 35 and/or the via stub 15b and 15b'.

The signal line 35 is electrically isolated from the defected ground plane 25, and can be formed from a metal or metal alloy, e.g., aluminum, copper or tungsten or any compatible Si material, using conventional CVD processes. The signal line 35 can be electrically connected to a signal line 40 of a microstrip line for connecting to devices or circuit blocks, for example. The signal line 40 and ground line 30 form a microstrip line with certain characteristic impedance, e.g., 50 Ohm, to provide a signal path between devices or circuit blocks. In this way, the signal line 35 will act as a metal trace with one end as a feeding point from the signal line 40 of the connecting microstrip line and the other end connecting to the via stub 15b (or via stud extension 15b'), e.g., open ended via. In embodiments, the signal line 35 and the signal line 40 can be formed at the same level of the structure, using conventional lithography, etching and deposition (e.g., CVD) processes.

Although the present invention is described with regard to the signal line 35 of the notch filter and the signal line 40 of the connecting microstrip line being provided at an upper layer of the structure, the present invention also contemplates the signal lines 35 and 40 being formed below the defected ground plane 25 and ground line 30. In either scenarios, the defected ground plane 25 and the ground line 30 are electrically isolated from the signal lines 35 and 40 by one or more BEOL dielectric layers of the substrate 20. Additionally, the present invention contemplates thinning of the silicon-based substrate portion of the substrate 20, but such thinning would preferably not expose the silicon via stubs 15. If silicon via stubs 15 are exposed, it should remain an open circuit, e.g., not connected to a bottom ground plane or any other device as in conventional through silicon via technologies.

Also, it should be understood by those of skill in the art that the notch filter 10 of the present invention provides greater design flexibility. For example, any of the following structures of the present invention can be adjusted in order to tune the performance of the notch filter, e.g., reflection, filtering, notch frequency of the filter, etc.:

(i) number of vias 15;
(ii) spacing of vias 15;
(iii) dimensions of vias 15, e.g., length, width and/or thickness;
(iv) dimensions of ground opening 25a; and/or
(v) dimensions of the signal lines 35 or 40.

Also, although the present invention is described with regard to microstrip type structures, which are normally associated with a signal line and a ground line/plane at different metal levels, it should be understood by those of skill in the art that the present invention can also be arranged as coplanar waveguide type structures, which are normally associated with a signal line and two side ground lines at the same metal level, or other types of transmission line structures. These other types of transmission line structures can be, for example, microstrip line with side shields or grounded coplanar waveguides, strip lines, or hybrid types.

Figure 2:
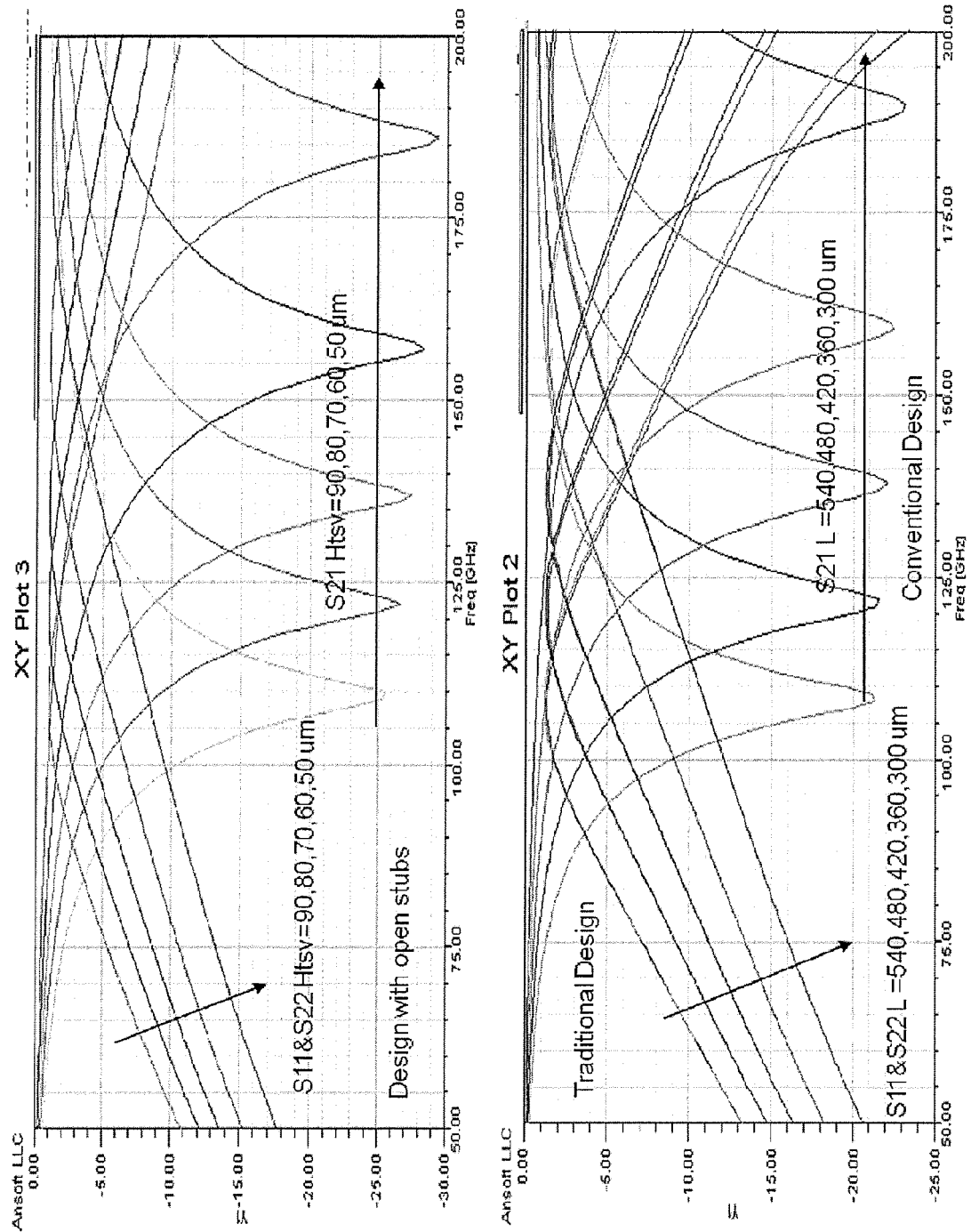
FIG. 2 shows simulated performance graphs of conventional on-chip microstrip line notch filters and the notch filter of the present invention.

FIG. 2 shows simulated performance graphs of conventional on-chip microstrip line notch filters and the notch filter of the present invention. More specifically, the top graph of FIG. 2 simulates the performance of the notch filter of the present invention; whereas, the bottom graph of FIG. 2 simulates the performance of a conventional notch filter, e.g., on-chip microstrip line notch filter. In the graphs of FIG. 2, the "x" axis represents frequency and the "y" axis represents reflection/insertion loss in dB.

In embodiments, the simulations of FIG. 2 show that the notch filter design of the present invention has similar filtering performance as in the conventional systems. Importantly, though, as shown by the comparison of these graphs, the notch filter design of the present invention shows a larger notch depth (~-5 dB more). Also, although not shown in the graphs, these improved features are provided by the notch filter design of the present invention using approximately 40% less chip area than the conventional on-chip microstrip line designs. This improvement in chip area is a result of the vertical structures, e.g., via stubs 15a, formed partially through the silicon-based substrate portion of the substrate 20.

FIG. 3 shows a comparison of chip area used by the notch filter of the present invention and the conventional on-chip microstrip line notch filter. As seen in FIG. 3, the area of the notch filter of the present invention is significantly reduced compared to the conventional on-chip microstrip line notch filter with comparable notch frequencies. For example, as shown for a notch frequency of 191 GHz for a conventional on-chip microstrip line notch filter and a notch frequency of 187 GHz for the notch filter of the present invention, the chip area used by the notch filter of the present invention is about 41% less than the chip area used for a comparable conventional on-chip microstrip line notch filter.

Figure 4:
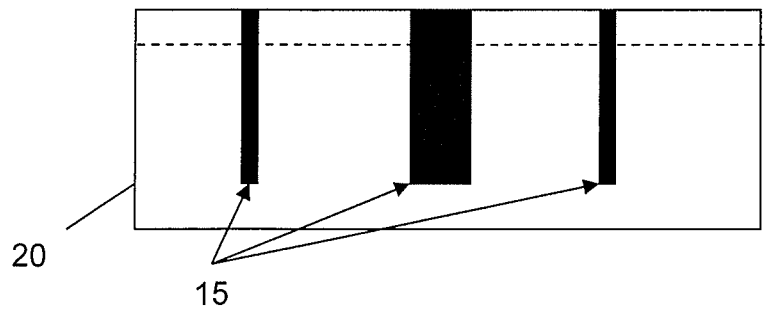
FIGS. 4, 5a, 5b, 6a, and 6b represent structures and respective processing steps for building the on-chip millimeter wave (mmW) notch filter with through silicon via stubs of the present invention.

FIGS. 4-6b represent structures and respective processing steps for building the structures in accordance with aspects of the present invention. Specifically, FIG. 4 shows a structure along line A-A of FIG. 1, which via stubs 15 are formed partially through the silicon-based substrate portion of the substrate 20. In embodiments, the via stubs 15 are formed by conventional lithography, etching and deposition steps.

For example, in FIG. 4, a resist can be provided on the substrate 20, which is exposed to energy, e.g., light, to form patterns (openings). The substrate 20 can then be patterned using conventional reactive ion etching (RIE) processes, to form openings that correspond in depth, width and length to the via stubs 15 as described above. A metal material can then be deposited within the openings using conventional deposition methods, e.g., CVD. The metal can be, for example, tungsten, copper, aluminum or other Si compatible metals.

As shown in FIG. 4, the via stubs 15 can be provided in different orientations, depending on the design of the notch filter of the present invention. In embodiments, any excess metal deposited on a surface of the substrate 20 can be removed using conventional chemical mechanical polishing (CMP). As should be understood by those of skill in the art and as discussed herein and further represented by the dashed line in FIG. 4, the via stubs 15 can be provided in back end of the line layers, e.g., one or more dielectric layers above the silicon-based substrate.

Figure 5A:
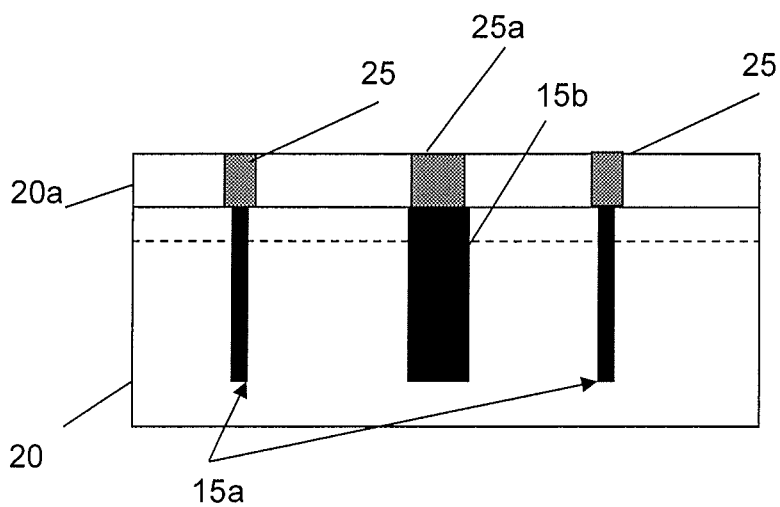

FIG. 5a represents additional process steps and a structure along line A-A of FIG. 1. More specifically, in FIG. 5a, the defected ground plane 25 is formed in an upper layer 20a of the substrate 20, and in direct electrical contact with the via stubs 15a. In embodiments, the defected ground plane 25 can be formed by either an additive process or a subtractive process, in accordance with conventional fabrication processes. In either additive or subtractive processes, the additional layer of substrate 20a is formed over the substrate 20 and via stubs 15a, 15b. In embodiments, the substrate 20a can be any appropriate dielectric layer.

By way of example, after adding the additional layer of dielectric 20a by conventional deposition processes, e.g., CVD, the additive process comprises forming a resist on the additional layer of the dielectric 20a and exposing such resist to energy, e.g., light, to form patterns (openings). The additional layer of substrate (dielectric) 20a can then be patterned using conventional reactive ion etching (RIE) processes, to form a pattern that exposes the underlying via stubs 15, and which corresponds in depth, width and length to the defected ground 25, as described above. A metal material can then be deposited within the pattern using conventional deposition methods, e.g., CVD. The metal can be, for example, tungsten, copper, aluminum or other Si compatible metals. In embodiments, any excess metal deposited on a surface of the additional layer of dielectric 20a can be removed using conventional chemical mechanical polishing (CMP).

In comparison, in a subtractive process, the metal material can be deposited on a dielectric layer, such as layer 20a, above the silicon-based substrate of the substrate 20, and patterned using conventional deposition, lithography and etching steps. After the metal is patterned to form the defected ground plane 25, an additional dielectric layer, similar to layer 20a, can be formed on the existing substrate 20 (and over the defected ground plane 25). The additional dielectric material can then undergo a planarization process in order to expose a top portion of the defected ground plane 25. In embodiments, the additional dielectric material and a top surface of the defected ground plane 25 can be planar.

Figure 5B:
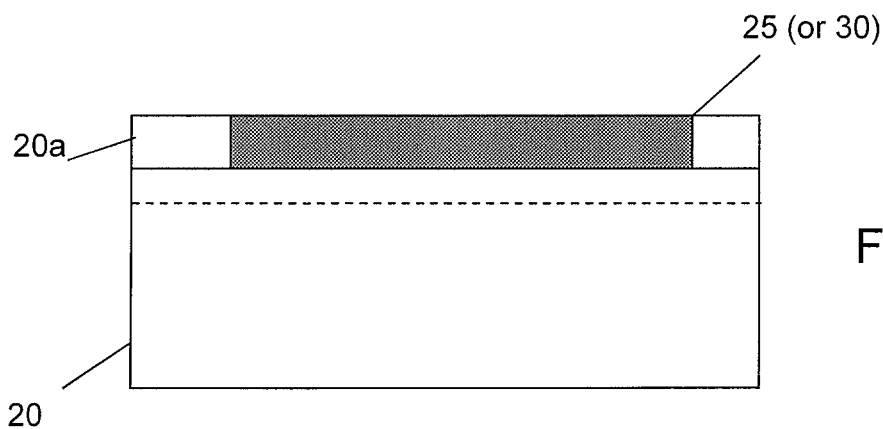

FIG. 5b represents the same process steps described with regard to FIG. 5a, but showing a structure along line B-B or line B'-B' of FIG. 1. The structures of FIGS. 5a and 5b are formed at a same level of the structure. More specifically, in FIG. 5b, another portion of the defected ground plane 25 is shown. This other portion can represent either a portion of the defected ground plane 25 remote from the ground line 30

(corresponding to line B-B) or in direct contact with the ground line 30 (corresponding to line B'-B'). It should be understood by those of skill in the art that the portions of the defected ground plane 25 shown in FIGS. 5a and 5b will form the ground opening 25a of FIG. 1. Also, although the present invention contemplates a square opening, other shaped openings are also contemplated by the present invention, e.g., circular, oval, rectangular, etc., depending on the pattern formed through the etching process and desired performance criteria.

FIG. 5b can equally represent the ground line 30 taken along line C-C of FIG. 1. More specifically, FIG. 5b can represent the formation of the ground line 30, which can be formed in the same processing steps as the defected ground plane 25. The via pad 25a shown in FIG. 5a is formed in the process for the defected ground plane 25 shown in FIG. 5b.

Figure 6A:
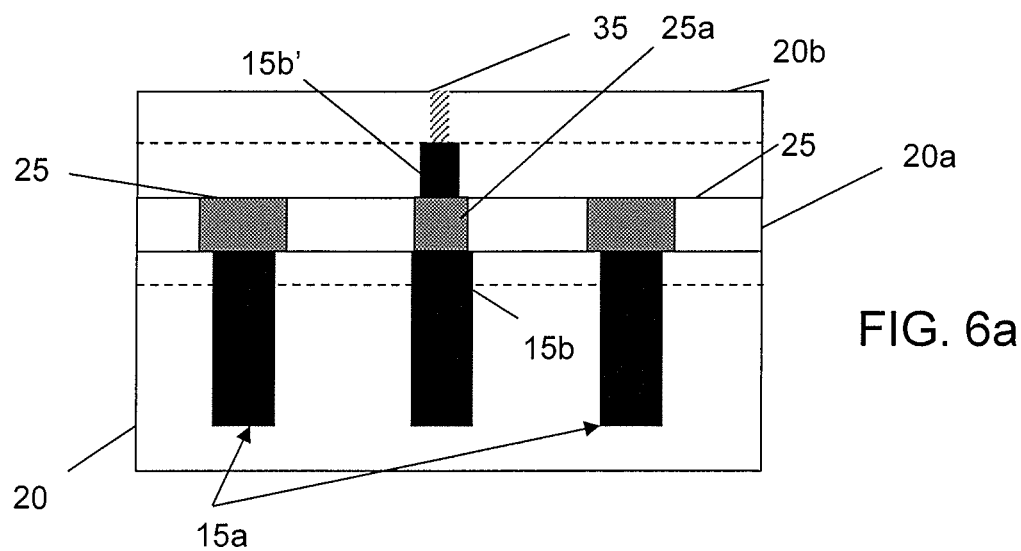

FIG. 6a represents a structure and respective processing steps along line A-A of FIG. 1, above a level of the defected ground plane 25. More specifically, as shown in FIG. 6a, the extension 15b' and signal line 35 are formed in electrical contact with the via pad of the via stub 15b. In this representation, an additional layer of dielectric 20b can be formed on the dielectric layer 20a, above a level of the defected ground plane 25. The additional layer of dielectric 20b can then undergo a dual damascene etching process to form a via and trench structure. The via can be filled with metal using a conventional deposition process, e.g., CVD, to form the via stub extension 15b', in direct electrical contact with the via pad 25a of the via stub 15b. Additional metal can be deposited in the trench to form the signal line 35, in direct electrical contact with the via stub extension 15b'. The metal for both the via stub extension 15b' and signal line 35 can be, for example, tungsten, copper, aluminum or other Si compatible metals. In embodiments, any excess metal deposited on a surface of the dielectric 20b can be removed using conventional chemical mechanical polishing (CMP).

In an alternative approach, the additional layer of substrate 20b can be two layers of substrate (dielectric layers), deposited in different processing steps. In this approach, after deposition of a first layer, the via stub extension 15b' can be formed by conventional lithography, etching and deposition steps. A second layer of substrate can then be formed over the via stub extension 15b', which is also subject to conventional lithography, etching and deposition steps to form the signal line 35. The signal line 35 can also be formed using a subtractive process, as already described herein.

Figure 6B:
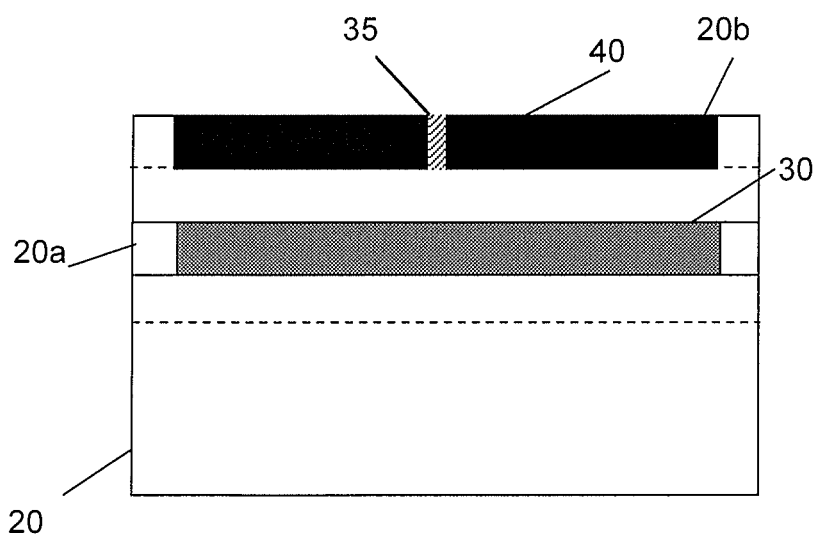

FIG. 6b represents a structure and respective processing steps along line D-D of FIG. 1, above a layer of the ground line 30. More specifically, as shown in FIG. 6b, the signal lines 35 and 40 are shown to be formed over the ground line 30, using the processing steps of FIG. 6a. That is, the signal line 40 can be formed in the same level of the structure and using the same processing steps as described with regard to FIG. 6a.

Figure 7:
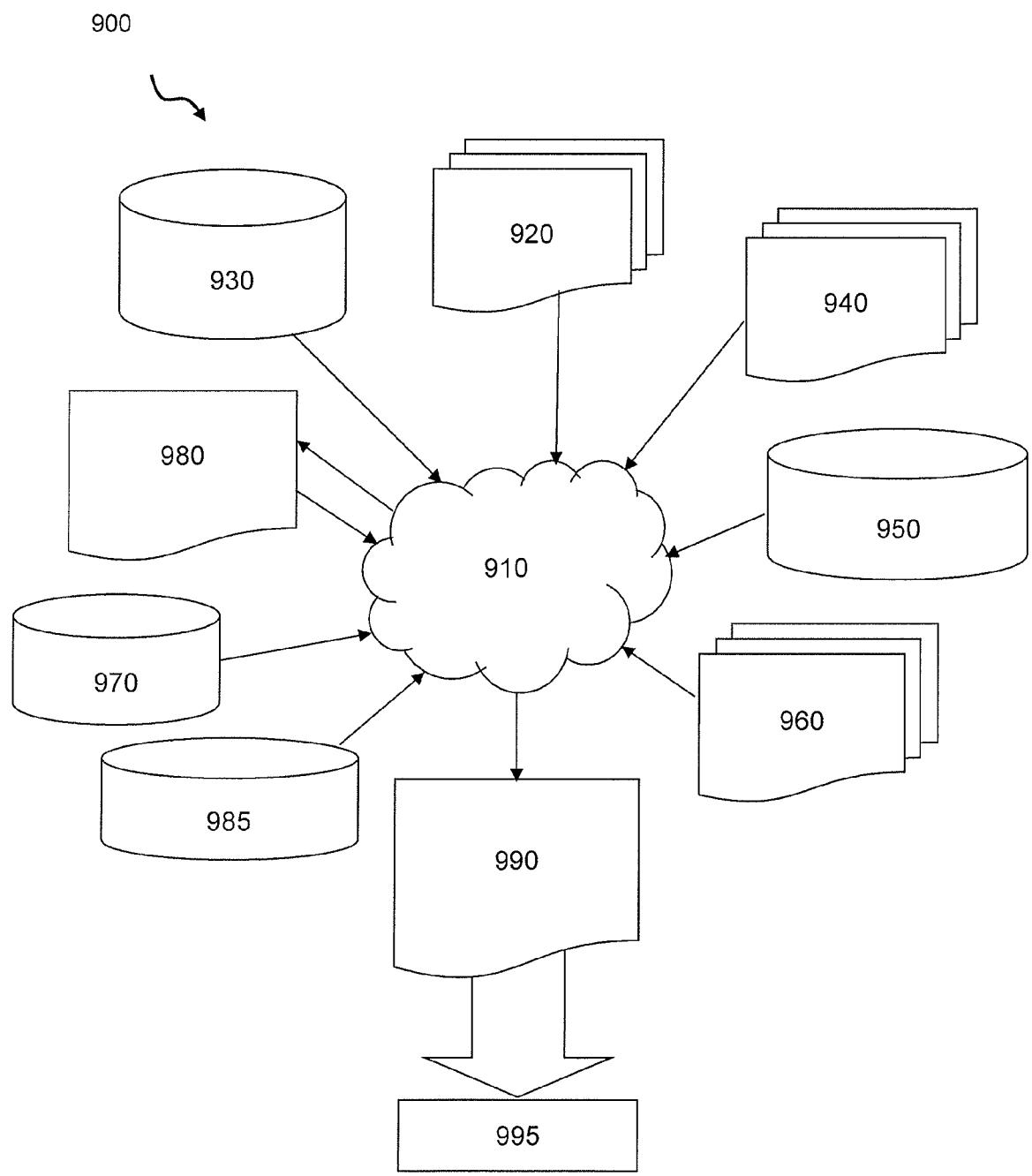
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 4, 5a, 5b, 6a and 6b. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 4, 5a, 5b, 6a and 6b. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 4, 5a, 5b, 6a and 6b to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 4, 5a, 5b, 6a and 6b. In one embodiment, design structure 990 may comprise a compiled, executable HDL simulation model that functionally simulates the devices shown in FIGS. 1, 4, 5a, 5b, 6a and 6b.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 4, 5a, 5b, 6a and 6b. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A notch filter comprising:
   a first signal line comprising a metal trace line connected to a metal via stub partially extending into a semiconductor substrate; and
   a ground plane with a ground opening, the ground plane being connected to at least one or more additional metal via stubs partially extending from the ground plane into the semiconductor substrate.

2. The notch filter of claim 1, wherein the metal trace line is provided at a different level than the ground plane.

3. The notch filter of claim 1, wherein the metal trace line is provided above the ground plane, with a dielectric layer therebetween.

4. The notch filter of claim 1, wherein the metal via stub goes through the ground opening to connect to the metal trace line.

5. The notch filter of claim 4, wherein the metal via stub includes a metal via stub extension, the metal via stub extension electrically connects directly to the metal via stub and the metal trace line.

6. The notch filter of claim 1, wherein the metal via stub and the at least one or more additional metal via stubs are open ended at one side and embedded within the semiconductor substrate; and the metal via stub and the at least one or more additional metal via stubs are not coupled to the ground plane.

7. The notch filter of claim 1, wherein the metal trace line connects to a second signal line of a microstrip line, at a different level than the ground plane.

8. The notch filter of claim 7, wherein the second signal line is above the ground plane and at a same level as the metal trace line.

9. The notch filter of claim 1, wherein the metal trace line extends above the ground opening in the ground plane.

10. The notch filter of claim 9, wherein the ground opening is surrounding the metal via stub.

11. The notch filter of claim 1, wherein the metal via stub is provided in a different orientation than the at least one or more additional metal via stubs partially extending from the ground plane into the semiconductor substrate.

12. A method in a computer-aided design system for generating a functional design model of a notch filter, the method comprising:
    generating a functional representation of a transmission line comprising a first signal trace line connected to a via stub partially extending into a substrate and the via stub is open ended; and
    generating a functional representation of a ground plane connected to at least one or more additional via stubs partially extending from the ground plane into the semiconductor substrate and the at least one or more additional via stubs are open ended, wherein the ground plane is provided on a different level than the first signal trace line.

13. The method of claim 12, further comprising generating a functional representation of the first signal trace line to be provided above the ground plane, with a dielectric there between.

14. The method of claim 12, further comprising:
    generating a functional representation of the ground plane to include an opening; and
    generating a functional representation of the first signal trace line to include the metal via stub going through the ground opening to connect to the first signal trace line.

15. The method of claim 14, further comprising generating a functional representation of the via stub to include a via stub extension, the via stub extension electrically connects directly to the via stub and the first signal trace line.

16. The method of claim 12, further comprising generating a functional representation of the first signal trace line connecting to a second signal line of a microstrip line, at a different level than the ground plane.

17. The method of claim 16, wherein the second signal line is above the ground plane and at a same level as the first signal trace line.

18. The method of claim 12, wherein the via stub is provided in a different orientation than the at least one or more additional via stubs partially extending into the semiconductor substrate.

19. A method comprising:
    forming a plurality of via stubs partially within a semiconductor substrate and the plurality of via stubs are free at one end;
    forming a ground plane in a back end of the line process, the ground plane being formed with an opening; and
    forming a signal trace line in electrical contact with a via stub of the plurality of via stubs, through the opening of the ground plane, the signal trace line being formed on a different level of a back end of line process than the ground plane.

20. The method of claim 19, further comprising:
    forming a back end of the line structures after forming the plurality of via stubs partially within the semiconductor substrate and which are free at one end; and
    the ground plane is formed below the signal trace line, and the signal trace line is in electrical contact with the via stub through a via stub extension.

* * * * *